(12) United States Patent
Vainshtein et al.

(10) Patent No.: US 6,870,194 B2
(45) Date of Patent: Mar. 22, 2005

(54) METHOD OF GENERATING OPTICAL RADIATION, AND OPTICAL RADIATION SOURCE

(75) Inventors: Sergey Vainshtein, Oulu (FI); Juha Tapio Kostamovaara, Oulu (FI); Larisa Shestak, Saratov (RU); Mikhail Sverdlov, Saratov (RU)

(73) Assignee: Oulun Yliopisto, Oulun Yliopisto (FI)

( * ) Notice: Subject to any disclaimer, the term of this patent is extended or adjusted under 35 U.S.C. 154(b) by 102 days.

(21) Appl. No.: 10/350,068

(22) Filed: Jan. 24, 2003

(65) Prior Publication Data

US 2004/0012012 A1 Jan. 22, 2004

(30) Foreign Application Priority Data

Jan. 24, 2002 (FI) .............................................. 20020133

(51) Int. Cl.[7] .......................... H01L 27/15; H01L 21/00
(52) U.S. Cl. ............................ 257/79; 257/13; 257/84; 257/94; 438/22; 438/24
(58) Field of Search ............................. 257/79, 13, 82, 257/83, 84, 85, 94, 96, 97, 99; 438/22, 24, 46, 47

(56) References Cited

U.S. PATENT DOCUMENTS

| | | | | | |
|---|---|---|---|---|---|
| 4,806,997 A | * | 2/1989 | Simmons et al. | ........... | 327/512 |
| 5,010,374 A | * | 4/1991 | Cooke et al. | .................. | 372/45 |
| 5,338,944 A | * | 8/1994 | Edmond et al. | ............... | 257/76 |
| 6,285,697 B1 | * | 9/2001 | Landwehr et al. | ............ | 372/45 |

* cited by examiner

*Primary Examiner*—Long Pham
*Assistant Examiner*—Dilinh Nguyen
(74) *Attorney, Agent, or Firm*—Young & Thompson

(57) ABSTRACT

An apparatus and a method are provided for generating an optical pulse by using a current pulse. The arrangement is based on a specific semiconductor structure, where a carrier injector is separated from the optically active region by a potential barrier for the injected carriers and on low carrier mobility in the semiconductor component, which features give rise to formation of a current-assisted strong electric field in the optically active region at moderate current densities before positive net gain is achieved. The current-assisted electric field broadens the gain spectrum in the active layer thus suppressing positive net gain and permitting carrier accumulation in the active layer. When the current pulse is stopped, the positive net gain is achieved, giving rise to an optical emission from the active layer.

28 Claims, 6 Drawing Sheets

METHOD OF GENERATING OPTICAL RADIATION, AND OPTICAL RADIATION SOURCE

FIELD

Figure 1A:
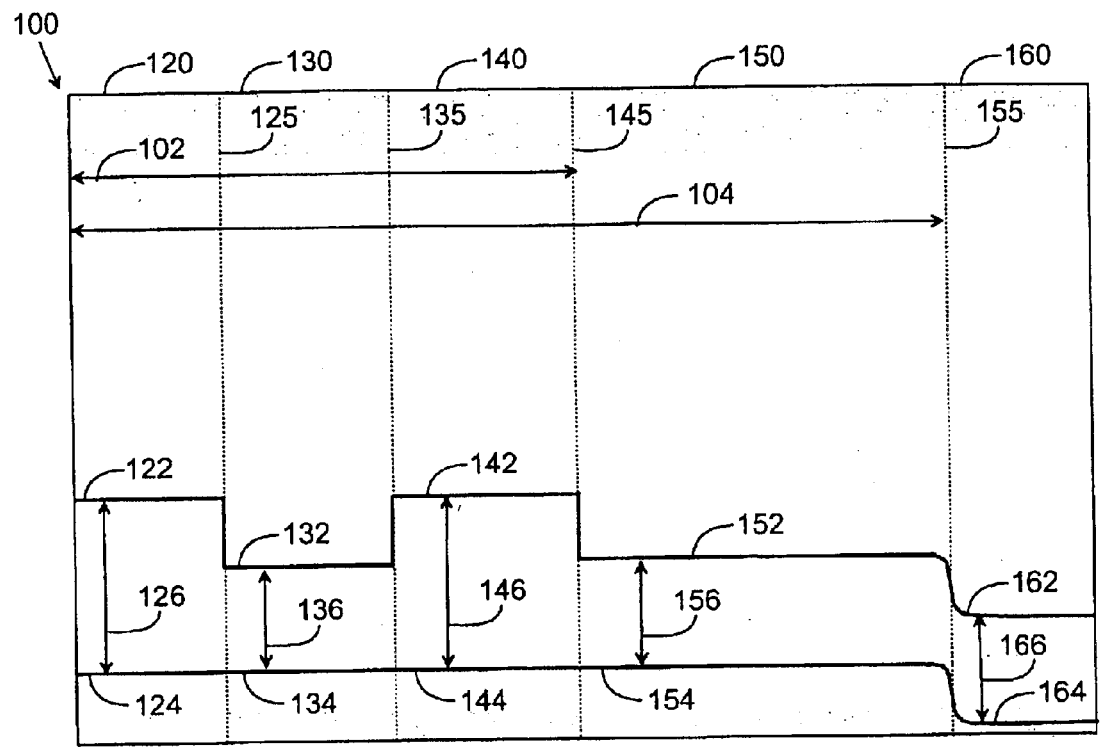

The invention relates to a method of generating optical radiation, and to an optical radiation source implementing the method.

BACKGROUND

A number of up-to-date applications, including advanced radars with high single-shot resolution, precise 3-D imaging, laser tomography, time imaging spectroscopy, etc., require low-cost, compact and reliable sources enabling generation of high-power ($10–10^3$ W) single optical pulses in the picosecond range, which optical pulses can be produced typically by laser-based light sources such as solid and dye microcavity lasers and semiconductor laser diodes. However, in many cases the use of solid and dye microcavity lasers is limited for applications such as those mentioned above due to their relatively high cost and large dimensions as compared with semiconductor laser diodes.

Producing picosecond high-power pulses with semiconductor laser diodes can be based on various operating modes. In the gain-switching mode, a picosecond optical pulse is achieved due to significant gain overshoot over the optical losses as a result of a sufficiently short leading edge of the pumping current pulse. In the gain-switching mode, optical power of typically ~0.1 W for a 10×400 µm laser chip can be obtained in a single optical pulse, which fulfils the power requirements in some applications. However, the gain-switching method sets high requirements for the current drivers since the rise time of the current pulse has to be shorter than the characteristic lasing delay. Such current drivers are not commercially available, particularly for high-power laser diodes.

Alternatively, the optical power in a picosecond pulse can be increased drastically, if a Q-switched single-heterostructure laser diode is used. This method provides power as high as 10 W for a 10×400 µm laser chip. However, the operation of the Q-switched single-heterostructure laser diode is very complicated. Thirdly, a well-known method for high-power picosecond pulse generation utilizing diode lasers is the method of ion implantation. Ion implantation can be used for any type of diode laser for the formation of absorbing regions, which operate as an optical shutter. The maximum achievable optical power in the picosecond pulse is of the same magnitude as that obtained with a Q-switched single-heterostructure laser diode. However, the ion implantation techniques available are rather complicated and expensive, and the reliability of the laser diodes is questionable.

BRIEF DESCRIPTION

An object of the invention is to provide an improved method of generating an optical pulse, and an optical power source implementing the method.

This is achieved by an optical radiation source for generating an optical pulse, which source is a semiconductor component comprising several functionally interconnected semiconductor structures that comprise: a first contact layer and a second contact layer, to which an electric pulse is connected in order to supply energy to semiconductor layers between the contact layers; an active layer and a p-n junction, which p-n junction injects carriers towards the active layer as a result of the electric pulse, the carriers pumping energy into the active layer, which active layer is arranged to emit an optical pulse as a result of the electric pulse connected to the contact layers; a barrier layer, which is located between the active layer and the p-n junction; the active layer is located between the first contact layer and the barrier layer, the layers forming potential barriers on both sides of the active layer; the barrier layer is arranged to restrict the transfer of minority carriers to the active layer such that during the pulse leading edge, the carrier density in the active layer is below a threshold level required for generating an optical pulse; the overall net gain in the active layer is arranged to be negative during the electric pulse leading edge to prevent generation of an optical pulse; and during the pulse trailing edge, the overall net gain in the active layer is arranged to become positive and cause a stimulated emission, and the active layer is arranged to emit an optical pulse.

The invention also relates to a method of generating optical radiation in a semiconductor component comprising several functionally interconnected semiconductor structures, the method comprising steps of: connecting an electric pulse to a first contact layer and a second contact layer in order to supply energy to semiconductor layers between the contact layers; injecting carriers by means of the electric pulse from a p-n junction towards the active layer, the charge carriers pumping energy into the active layer; emitting an optical pulse from the active layer by means of the pumped energy; the semiconductor component also comprises a barrier layer, which is located between the active layer and the p-n junction; the active layer is located between the first contact layer and the barrier layer, which layers form potential barriers on both sides of the active layer; restricting the transfer of carriers to the active layer by the barrier layer so that during the pulse leading edge, the carrier density in the active layer is below a threshold level required for generation of an optical pulse; preventing generation of an optical pulse by means of negative overall net gain during the electric pulse leading edge; and emitting an optical pulse in the active layer as a result of positive overall net gain in the active layer during the electric pulse trailing edge.

Preferred embodiments of the invention are disclosed in the dependent claims.

In the present invention, an electric pulse is used for pumping, and an optical pulse is generated near the trailing edge of the electric pulse. The invention is based on a specific semiconductor structure, where the carrier injector is separated from an optically active region by a potential barrier for the injected carriers. This feature gives rise to formation of a current-assisted strong electric field in the optically active region without the lasing onset. The lower the carrier mobility in the active region, the lower the current density required for the effective operation of the field-assisted gain control, which determines high-power short-pulse light generation.

The method according to the invention provides several advantages. In an aspect of the invention, a short optical pulse is generated without high requirements for control electronics such as current drivers by means of a semiconductor structure, which can be manufactured by means of conventional band gap and doping engineering. In another aspect, the semiconductor structure according to the invention can be realized based on various semiconductor materials, thus providing means for wavelength control.

LIST OF THE FIGURES

Figure 1B:
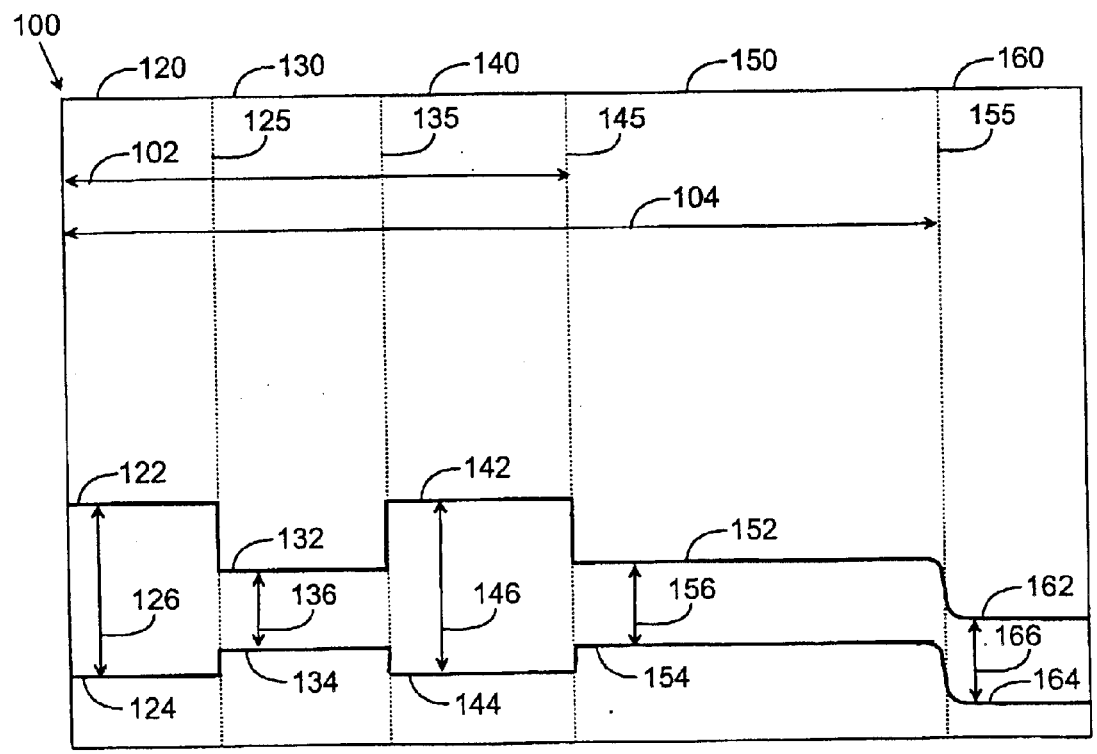
Figure 2:
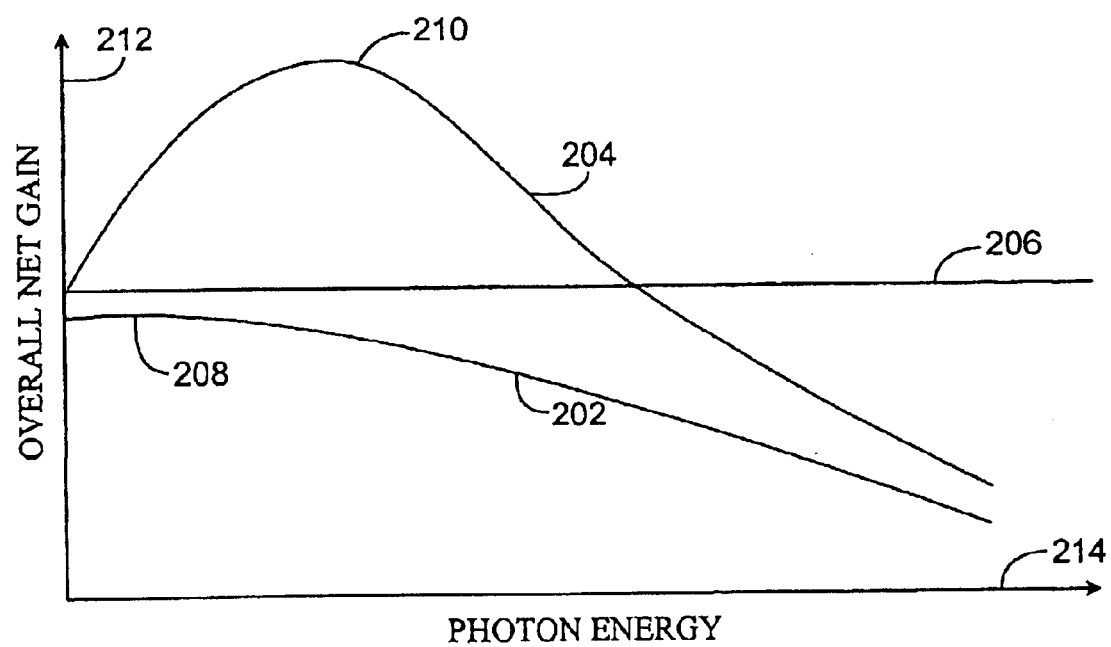
Figure 3:
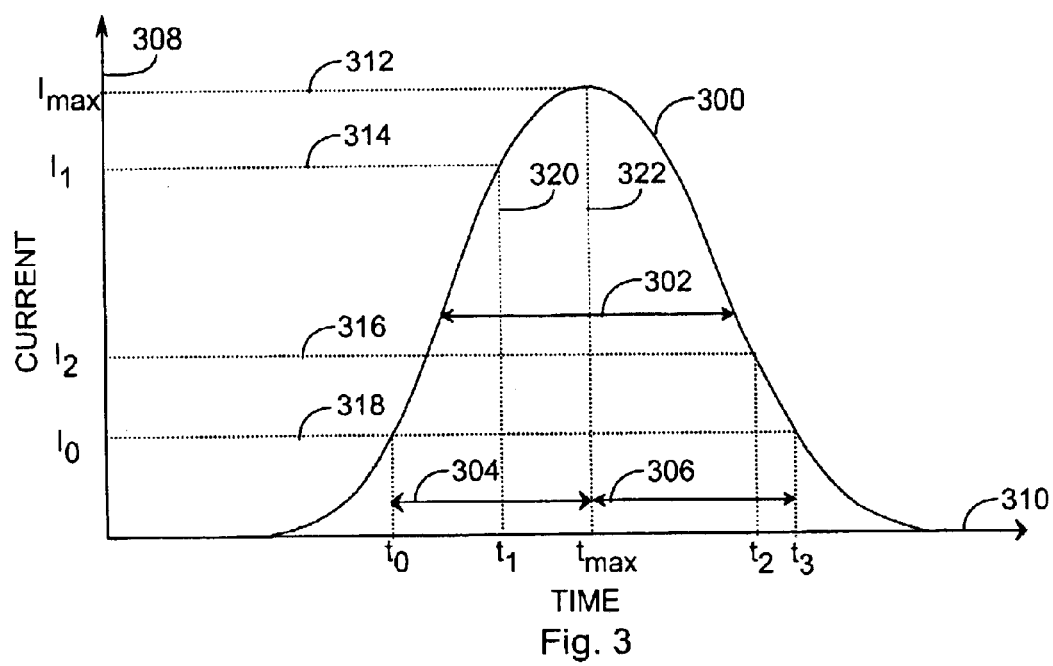
Figure 4:
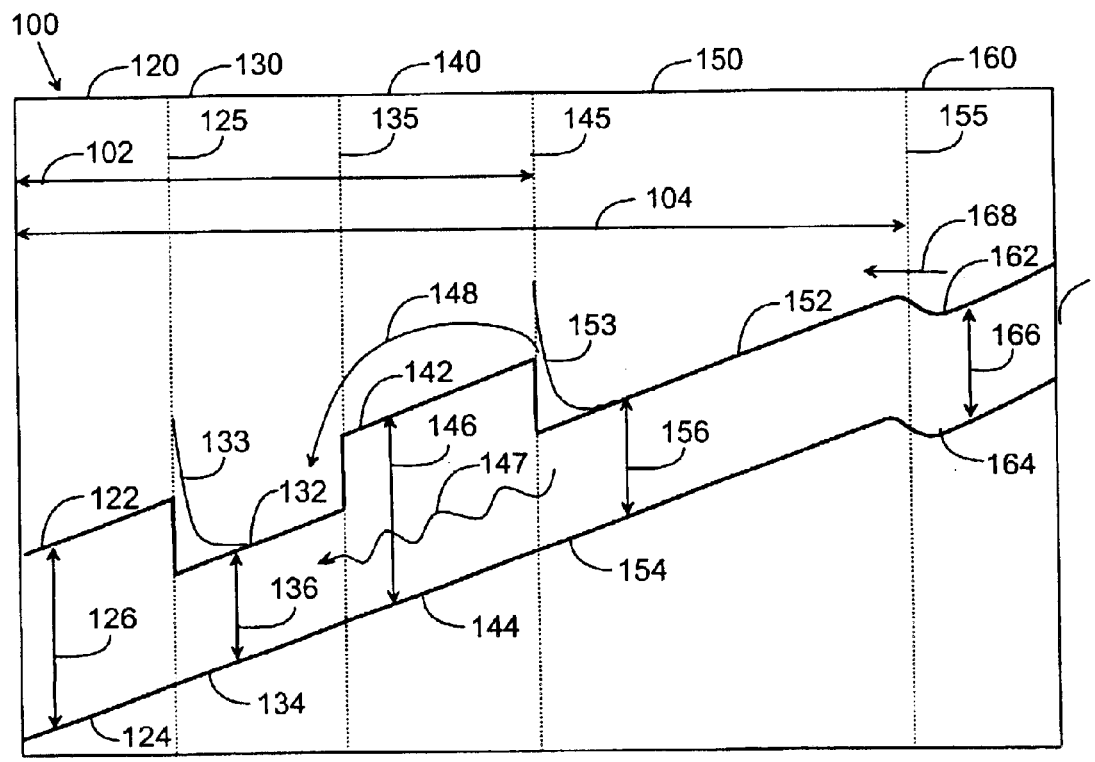
Figure 5:
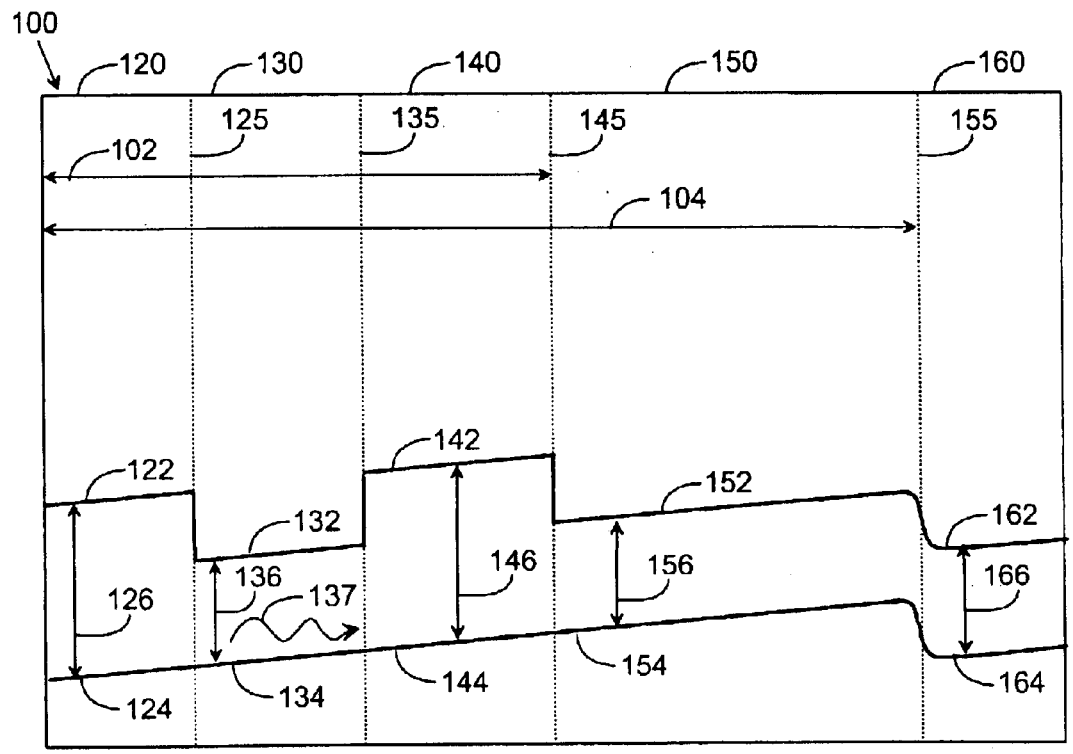
Figure 6:
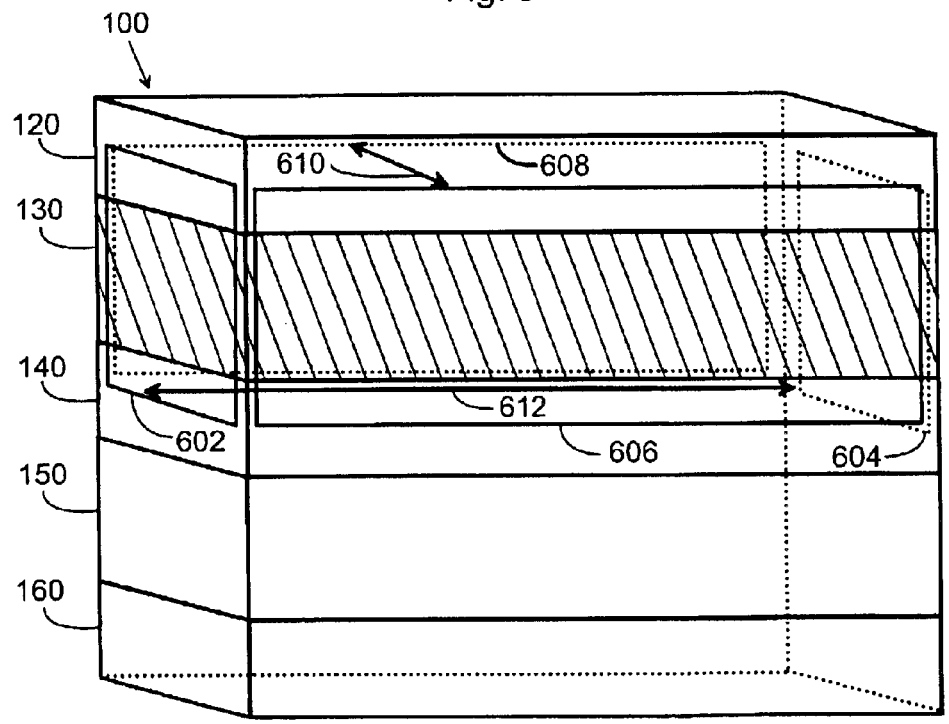
Figure 7A:
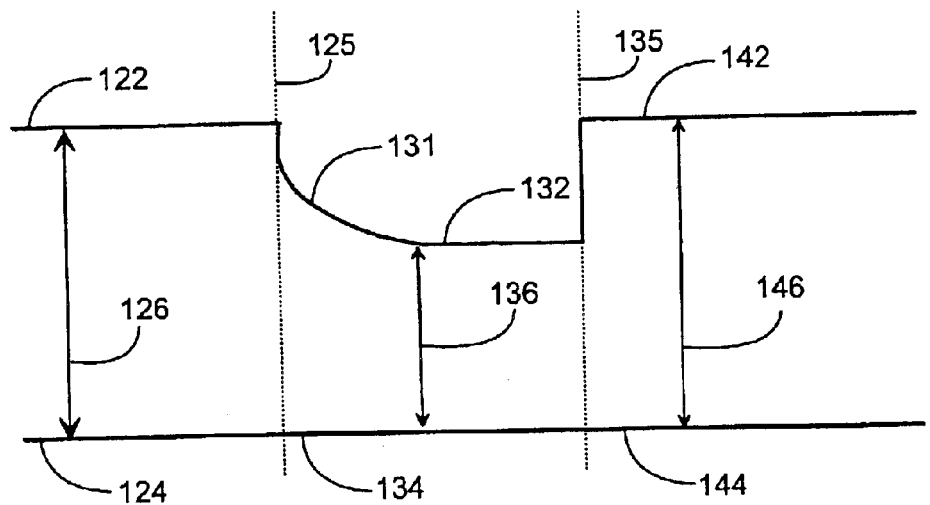
Figure 7B:
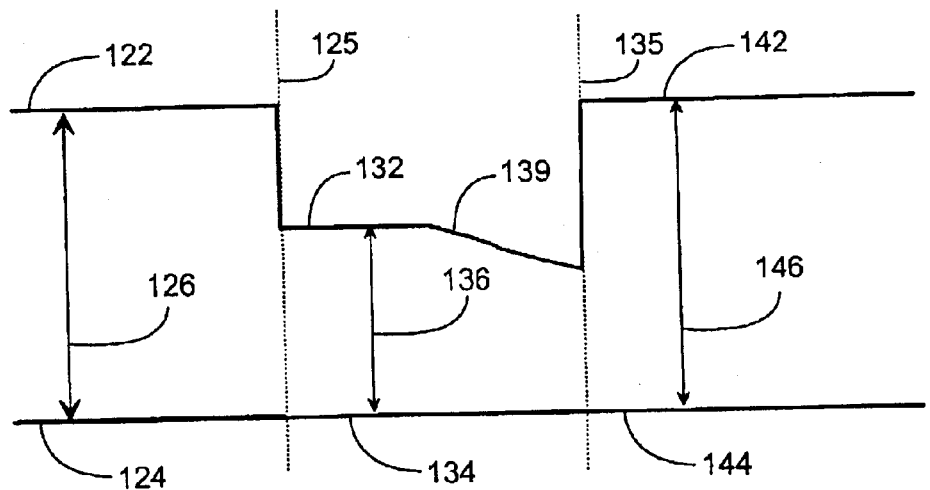
Figure 7C:
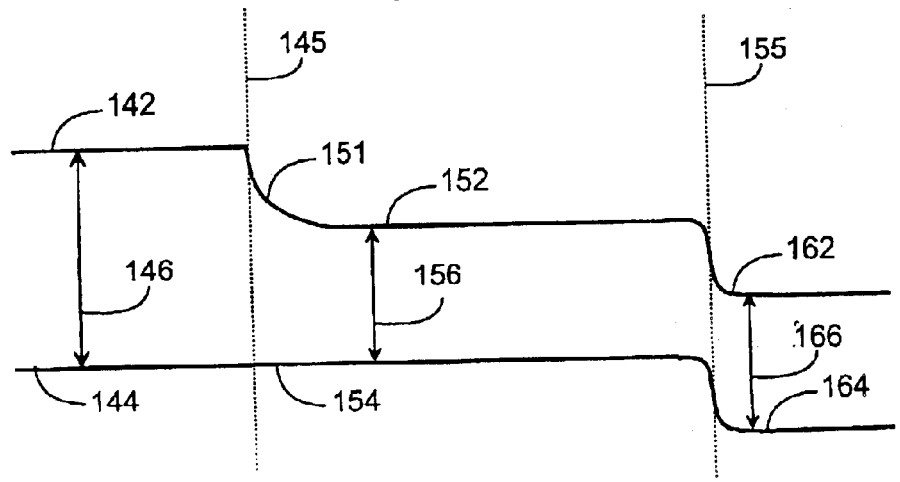
Figure 8:
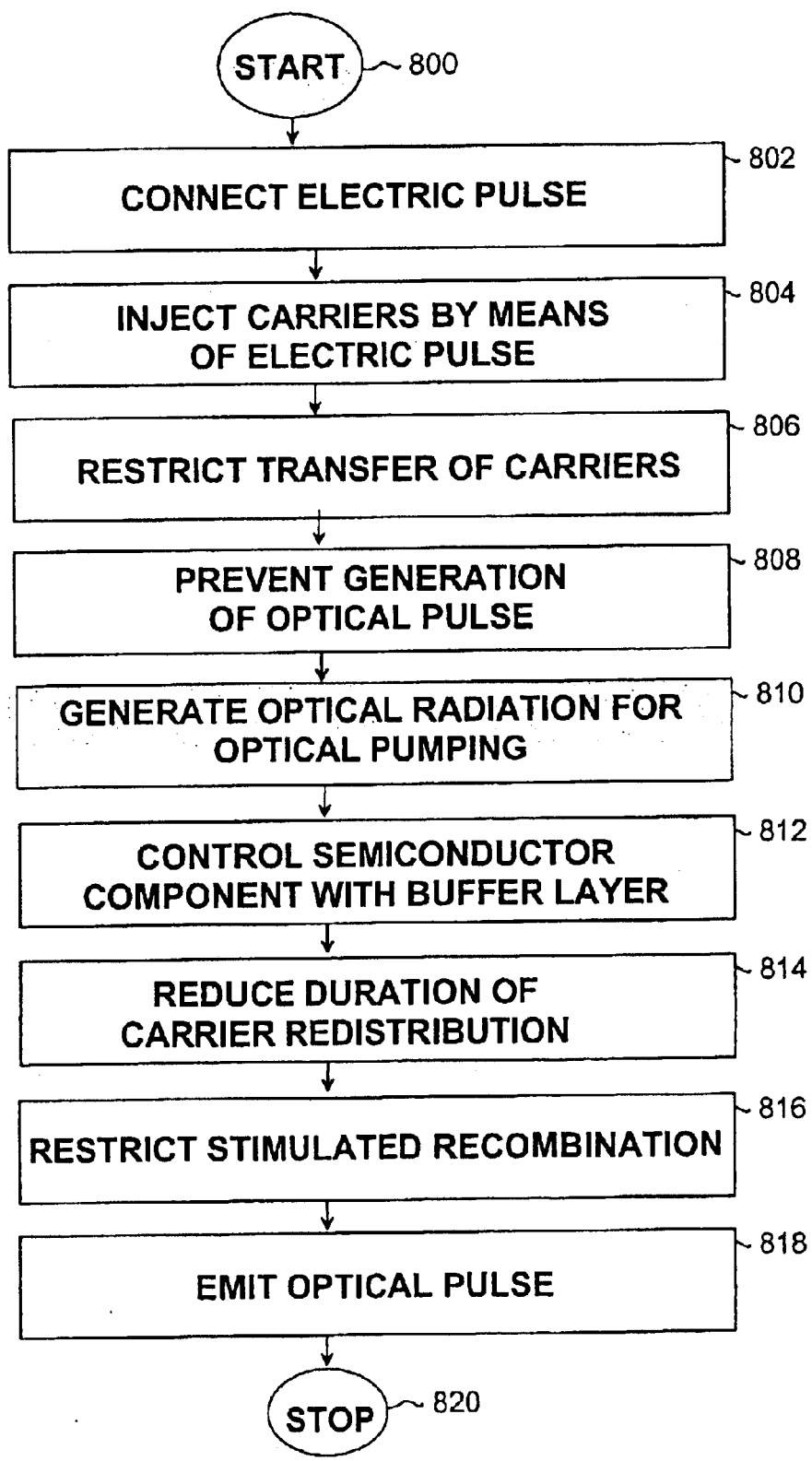

The invention will be described in more detail in connection with the preferred embodiments and with reference to the accompanying drawings, in which FIG. 1A shows a band diagram of a semiconductor component according to an embodiment, FIG. 1B shows a band diagram of a semiconductor component according to another embodiment, FIG. 2 shows two gain curves, FIG. 3 shows an electric pulse connected to a semiconductor component according to the present arrangement, FIG. 4 shows a band gap profile of the semiconductor component in the pulse leading edge, FIG. 5 shows a band diagram of the semiconductor component in the pulse trailing edge, FIG. 6 shows the structure of the semiconductor component during the trailing edge of the electric pulse, FIG. 7A shows a band gap profile of the active layer with the build-in electric field in the active layer according to an embodiment, FIG. 7B shows a band gap profile of the active layer according to another embodiment, FIG. 7C shows a band diagram of the buffer layer according to an embodiment, and FIG. 8 shows a flow diagram.

DESCRIPTION OF EMBODIMENTS

FIG. 1A shows the structure of a semiconductor component 100 according to a preferred embodiment of the present arrangement consisting of several doped semiconductor layers, i.e. a first contact layer 120 and a second contact layer 160, an active layer 130, and a barrier layer 140. In an embodiment, the semiconductor component comprises a buffer layer 150 located between the active layer 130 and the second contact layer 160 for constituting a p-n junction with the second contact layer 160. The vertical axis in FIG. 1A shows energy in an arbitrary unit, and the horizontal axis shows the distance in the transverse direction of the semiconductor component in arbitrary units. The energy structure of each layer 120, 130, 140, 150, 160 shows the bottom 122, 132, 142, 152, 162 of the conduction band of each layer and the top 124, 134, 144, 154, 164 of the valence band of each layer. In each layer 120, 130, 140, 150, 160, the band gap value 126, 136, 146, 156 and 166, respectively, present the energy distance between the top 124, 134, 144, 154, 164 of the valence band and the bottom 122, 132, 142, 152, 162 of the conduction band for each layer 120, 130, 140, 150, 160.

In an embodiment the contact layer 120, the active layer 130, and the barrier layer 140 are heavily doped p-type layers, and the second contact layer 160 is an n-type layer. This means that a p-n junction 155 is formed between the p-type layer 104 and the n-type layer 160. Electrons are injected into the p-type layer of the semiconductor component 100 when the component is forward biased. In this case, electrons are minority carriers in the p-type layer 104. The thin potential barriers in the valence band within heterojunctions 125, 135 and 145 are not shown in FIG. 1A since these barriers are transparent for the carrier tunnelling at the acceptor density of ~$10^{19}$ cm$^{-3}$.

The p-type layer 104 shown in FIG. 1A comprises a contact layer 120, an active layer 130, a barrier layer 140 and a buffer layer 150. The contact layer 120, the active layer 130 and the barrier layer 140 constitute a double-heterojunction-like structure 102, where the band gap 136 of the active layer 130 formed between the contact layer 120 and the barrier layer 140 is narrower than the band gap 126 of the contact layer 120 and the band gap 146 of the barrier layer 140 surrounding the active layer 130. However, the double-heterojunction-like structure 102 in the present invention differs from the conventional double-heterojunction structure, in which the p-n junction coincides with one of the hetero-barriers, and the active region is not doped on purpose.

The contact layers 120 and 160 together form electric contacts of the semiconductor component 100, and an electric pulse can be connected thereto for example via a semiconductor layer or a layer of some other material not shown in FIG. 1A. The active layer 130 of FIG. 1A forms the optically active region, in which the optical pulse is generated. In the present arrangement, it is essential that the optical gain in the active layer 130 can be controlled by an electric field $\overline{F}$ induced by current density j.

This control can be realized at a successfully high current density, which is mainly determined by its drift component $$j = q \cdot (n \cdot \mu_n + p \cdot \mu_p) \cdot \overline{F} \quad (1)$$

where q is the electron charge, n and p are the electron and hole concentrations, respectively, and $\mu_n$ and $\mu_p$ are the electron and hole mobilities, respectively. In an embodiment, the carrier mobilities are $\mu_n$~1200 cm$^2$/Vs and $\mu_p$~60 cm$^2$/Vs in heavily doped GaAs and Al$_x$Ga1$_{-x}$As.

FIG. 2 shows two curves 202, 204 representing overall net gain against photon energy in the active layer 130, which overall net gain is formed in the curves 202, 204 by integrating the optical gain over the active layer 130. The curves 202, 204 present overall net gain spectra. The overall net gain accounts for the overall gain and the optical losses. The overall gain is the local gain integrated across in transverse direction of the active layer 130 over the optical mode shape. That is, for each transverse coordinate, the value of the local gain is multiplied to the amplitude of the optical field and this product is further integrated over the spatial coordinates. The local optical gain is the incremental factor of the photon density per a unit photon pass at a given point of the amplifying medium. The vertical axis 212 of FIG. 2 shows the overall net gain in an arbitrary unit, and the horizontal axis 214 shows the photon energy in an arbitrary unit. The horizontal line 206 shows the zero overall net gain, above which the active layer 130 is capable of producing the stimulated emission required for the optical pulse generation, Curve 202 shows the overall net gain of the active layer 130, which is subject to a strong electric field. The gain spectrum is then very wide and the gain amplitude is low, thus suppressing premature lasing and permitting carrier accumulation in the active layer 130. In such a case, the gain amplitude 208 in the active layer 130 is below the level 206 required for generating an optical pulse. Curve 204, in turn, shows the overall net gain during a trailing edge of an electric pulse, such as current pulse. The gain spectrum is then narrow, and the gain amplitude 210 is thus above the threshold level 206 required for generating an optical pulse.

In an embodiment, the contact layer 120 and the barrier layer 140 of the double-heterojunction-like structure 102 consist of semiconductor layers of about 2 $\mu$m in thickness. The thickness of the active layer 130 varies between 2 and 10 $\mu$m. In the present arrangement, a buffer layer 150 of about 5 $\mu$m is formed between the double-heterojunction-like structure 102 and the p-n junction 155, and it is formed such that the band gap 156 of the buffer layer 150 is narrower than the band gap 146 of the barrier layer 140. In an embodiment, the buffer layer 150 is doped similarly to the active layer 130. The barrier layer 140 thus forms a potential barrier between the active layer 130 and the buffer layer 150, restricting the transfer of carriers to the active layer 130 and causing a carrier accumulation 153 in the buffer layer 150 near a junction 145. The transfer of carriers is mainly due to drift and diffusion mechanisms. Another purpose of the buffer layer 150 is to form the p-n junction 155 with the contact layer 160.

In an embodiment, the transfer of carriers in the buffer layer 150 depends on the strength of the electric pulse 300 connected to the contact layers 120, 160.

In an embodiment, the contact layer 120, the active layer 130 and the barrier layer 140 are formed on an $Al_xGa_{1-x}As$ (aluminum Gallium Arsenide) material, which is subjected to heavy doping. In an embodiment, the active layer 130, the contact layer 120 and the barrier layer 140 are doped with zinc atoms. The sufficient acceptor density, however, should in any case exceed the transparency concentration in the active layer 130. The transparency concentration is of the order of $5 \times 10^{17}$ cm$^{-3}$ in GaAs. In an embodiment, the acceptor density of layers 120, 130 and 140 is $\sim 10^{19}$ cm$^{-3}$.

In an embodiment, the aluminum composition x in the contact layer 120 and in the barrier layer 140 is approximately 0.3, and that in the active layer 130 is approximately zero. In another embodiment, x varies across the active layer 130.

In an embodiment, the n-type contact layer 160 is formed on the GaAs substrate, which can be doped with tellurium. The donor density may vary between $2 \cdot 10^{18}$ and $4 \cdot 10^{18}$ cm$^{-3}$.

The semiconductor structure 100 can be grown, for example, at 800 to 850° C. by using an LPE (Liquid Phase Epitaxy) method. In an embodiment, the layer 104 is doped during the growing, and the location of the p-n junction is determined from the double-heterojunction-like structure 102 by the Zinc diffusion produced during the growing process.

In the present arrangement, the semiconductor component 100 is arranged to restrict carrier mobility with respect to the voltage acting over the semiconductor component 100. This can be achieved by heavily doping the semiconductor component 100 layers. More precisely, by doping heavily layer 104, the carrier mobility is reduced, thus reducing the peak current density and supporting the mechanism of the field assisted gain control.

The semiconductor component can be formed by any kind of technology, such as LPE, which permits relatively thick layers and heavy doping of some semiconductor layers to be obtained.

The band diagram in FIG. 1A shows the discontinuity in the conduction band, while the potential barriers are practically absent in the valence band for the semiconductor layers 120, 130, 140 and 160.

In FIG. 1B, layer 104 forms a p-type layer and layer 160 forms an n-type layer. The operation of the semiconductor component shown in FIG. 1B essentially corresponds to the situation shown in FIG. 1A. The band gap profile given in FIG. 1B can be obtained by known methods of band gap engineering.

A semiconductor component similar to those shown in FIGS. 1A and 2B can also be implemented such that layer 104 forms an n-type layer and layer 160 forms a p-type layer.

Let us examine below a situation where an electric pulse 300 according to FIG. 3 is connected to the contact layers 120, 160 of the semiconductor component 100. The horizontal axis 310 of FIG. 3 shows time and the vertical axis 308 shows an electrical quantity, such as voltage or current, representing the pulse strength. For the sake of simplicity, it is assumed that the electric pulse 300 is a current pulse, and the vertical axis 308 shows current on an arbitrary scale.

In an embodiment, the current pulse 300 has a bell-like shape and the duration of the current pulse 300 is in the nanosecond range. However, any pulse shape is suitable as long as the pulse duration is sufficient and the trailing edge is sufficiently abrupt.

In an embodiment, the current pulse 300 implies with a negative current oscillation after the trailing edge of the current pulse 300. The peak value of the current density across the semiconductor component 100 may vary from $10^5$ to $10^6$ A/cm$^2$, depending on the carrier mobilities $\mu_n$ and $\mu_p$ in the active layer 130 and in the buffer layer 150. For example, for a chip of the semiconductor component 100 with 400 $\mu$m in length and 75 $\mu$m in width and with acceptor doping of $\sim 10^{19}$ cm$^{-3}$ in the region 104, the peak current value 312 of the order of 50 A can be sufficient for the realization of the field assisted gain control.

In an embodiment, the rise time 304 and the fall time 306 of an electric pulse are about $\sim 2$ ns and the full width half maximum (FWHM) 302 of the pulse 300 is $\sim 5$ ns.

Between instants $t_0$ and $t_1$ in FIG. 3, the current across the regions 120, 130 and 140 mainly corresponds to the drift current of the holes, and in the regions 150 and 160, respectively, to drift-diffusion current of the holes and the electrons. The average concentration of the electrons in the active layer 130 is substantially lower than the transparency concentration and even local optical gain is negative at each point of this region. At instant $t_1$, the current exceeds the magnitude of $\sim 10^5$ A/cm$^2$, which causes the electric field across the layers 120, 130, 140, and in the left-hand side of the buffer layer 150 to reach the level of $\sim 10^3$ V/cm.

FIG. 4 shows the band gap profile and the operation of the semiconductor component 100 according to FIG. 1A when a high current has been connected to the semiconductor component 100. A strong electric field causes the electron accumulation in the buffer region 150 near a high potential barrier 145 to the concentration of $\sim 10^{18}$–$10^{19}$ cm$^{-3}$, and the hole concentration near the barrier exceeds the equilibrium hole density by the same value. The resulting radiative recombination of the electrons and holes near the barrier produces photons 147 corresponding to the band gap 156 of the buffer layer 150, significant part of which will be absorbed in the active layer 130, thus creating the electrons in this potential well.

In an embodiment, the buffer layer 150 is arranged to generate optical radiation 147 for optical pumping of the active layer 130, and that the barrier layer 140 is arranged to be permeable to the optical radiation 147 generated by the buffer layer 150.

In an embodiment, the contact layer 160 is arranged to generate optical radiation 147 for optical pumping of the active layer 130.

In an embodiment, the band gap 136 of the optically active layer 130 and the band gap 156 of the buffer layer 150 are at least approximately equal in height in order enable the buffer layer 150 to perform optical pumping of the active layer 130. The band gaps 136 and 156 can be made approximately equal by suitably doping the active layer 130 and the buffer layer 150. An additional contribution to the process of the optical pumping of the active layer 130 will give the photons, generated around the p-n junction 155 in the regions 150 and 160. As a result, relatively effective carrier accumulation will start in the active region 130 at instant $t_1$. This will not cause lasing, however, during the current pulse duration because of the mechanism of field-assisted gain control. Indeed, in the presence of the strong electric field in the active layer 130, overall net gain 202 will not become positive even if the average electron density in the active layer 130 exceeds the threshold concentration, which is the sum of the transparency concentration and all optical losses. The positive overall net gain 204 and the stimulated emission will occur after the electric field in the active region 130 is significantly reduced between instants $t_2$ or $t_3$.

An advantage of this arrangement is that the electric pulse 300 described above can be generated by means of relatively simple electronics, which are commercially available. The structure of the current supply and the connection to the semiconductor component 100 are fully known per se.

The restricted drift of the carriers, and hence the intentional reduction in pumping efficiency caused by the barrier layer 140, plays an essential role in the presented semiconductor structure. The height and the thickness of the barrier layer 140 must be selected in such a way that the positive net gain and the resulting undesired premature optical pulse do not occur during the leading edge of the current pulse before a strong electric field appears in the active region 130.

In an embodiment, the efficiency of the optical pumping of the active region 130 due to optical radiation 147 through the barrier layer 140 depends on pumping current density and on the dimensions of the semiconductor component 100 in the longitudinal and in the lateral directions. The longitudinal direction 612 and the lateral direction 610 are shown in FIG. 6. When the electron concentration in the buffer layer 150 near the junction 145 exceeds the transparency concentration, the stimulated emission in the longitudinal direction 612 and lateral direction 610 removes efficiently photons from the buffer layer 150 and from the entire semiconductor component 100, thus reducing the carrier density in the buffer layer 150. Reduction in the carrier concentration in the buffer layer 150, in turn, will reduce the photon flux in the transverse direction thus limiting the rate of the carrier generation in the active layer 130. The effect of the component dimensions on the efficiency of the optical pumping of the active layer 130 will be more significant for the longitudinal direction 612 than for the lateral direction since the semiconductor mirrors enable stronger photon flux in the longitudinal direction 612.

The absorption of the optical radiation 147 into the active layer 130 can also be controlled with doping of the active layer 130. In an embodiment, the absorption coefficient of the optical radiation of the active layer is more than $5 \times 10^2$ cm$^{-1}$ and less than $1 \times 10^4$ cm$^{-1}$, depending on the wavelength of the radiation 147 and the doping level.

In a preferred embodiment, the band gap 136 of the optically active layer 130 and the band gap 156 of the buffer layer 150 are at least approximately equal in height in order to enable the buffer layer 150 to perform optical pumping of the active layer 130. As a result, the absorption coefficient of the active layer 130 increases and the optical pumping becomes more efficient. The band gaps 136 and 156 can be made approximately equal by suitably doping the active layer 130 and the buffer layer 150.

The absorption of the optical radiation 147 into the active layer 130 can be intensified for example by doping the active layer 130. In an embodiment, the absorption coefficient of the optical radiation of the active layer is thus $5 \cdot 10^2 \leq \alpha \leq 10^4$. The absorption coefficient $\alpha$ is dependent on the wavelength of the optical radiation 147 and the material composition and the doping. FIG. 5 shows the band gap profile of the semiconductor component 100, where the electric pulse 300 has propagated to instant $t_2$ situated on the trailing edge of the electric pulse 300. For clarity, instant $t_2$ is also referred to as an instant when the pulse stops. The electric field generated in the active layer 130 by the current pulse 300 connected to the contact layers 120, 160 at instant $t_2$ has substantially diminished such that net gain follows a distribution that is similar to curve 204 shown in FIG. 2. In such a case, the net gain spectrum of the active layer 130 has substantially narrowed, and the resulting high gain amplitude 210 causes generation of the short optical pulse 137.

As a result, the carrier redistribution in both coordinate and energy space remarkably narrows the gain spectrum and increases the gain amplitude 210, which is followed by a short optical pulse 137 emitted by the active layer 130. The photon energy of the optical pulse corresponds to the band gap 136 of the active layer 130.

The band gap 136 of the optically active layer 130 can be arranged to emit an optical pulse 137 at a desired wavelength. The desired wavelength is determined for example based on the intended use of the radiation generated by the semiconductor component 100. The band gap 136 of the active layer 130 can be arranged suitably for example by concentration of aluminum. In an embodiment, the wavelength of the photons emitted from the active layer 130 varies between 800 and 850 nm for an AlGaAs/GaAs system, but the present arrangement also enables other optical wavelengths.

In an embodiment, the semiconductor component 100 is made to operate as a laser diode such that the electric pulse 300 shown in FIG. 3 applied on the semiconductor component 100 provides a very short and high-power optical pulse 137. The FWHM (full width at half maximum) of the optical pulse 137 can be for example 20 to 25 ps and the maximum power can be for example 10 to 1000 W for a laser chip less than 100 μm in width. A high-power short optical pulse 137 is generated as the result of the pumping by the current pulse 300 connected to the contact layers 120 and 160. The population inversion is achieved in the active layer 130 and very high net optical gain in the active layer 130 is realized by a special arrangement of the semiconductor structure 100. A high peak 210 in the overall net gain 204 is achieved due to the implementation of the mechanism of field-assisted gain control. The laser can be pumped using relatively long current pulses 300 achievable from a simple commercially available current switch. This advantage is realized by intentionally reducing the pumping efficiency of the active layer 130. The reduced pumping efficiency is due to the barrier layer 140 between the active region 130 and the buffer layer 150.

In order to provide optical feedback, the active layer 130 can be arranged to operate as an optical resonator. Such a resonator can be formed for example by cleaving the opposite edges 602, 604 of the active layer 130 or the semiconductor component 100 shown in FIG. 6 into mirror surfaces such that the distances 610, 612 between opposite mirror surfaces can be multiples of half of the wavelength of the radiation emitted from the active layer 130. In an embodiment, the resonator length is for example 400 μm. The resonator width can be for example 70 μm. In an embodiment, the refractive index of the active layer 130 is greater than the refractive indices of the surrounding layers 120, 140 such that the active layer 130 constitutes an optical guide. This prevents the optical radiation 137 generated in the active layer 130 from being penetrated into the surrounding layers 120, 140 and simultaneously helps to form a structure that reflects optical radiation from the edges 602, 604. An optical guide can be formed by reducing the band gap 136 of the active layer 130 with respect to the band gaps 126 and 146 of the surrounding layers 120 and 140. The reduction can be implemented, for example, by a proper selection of an aluminum composition.

The structure of the semiconductor component 100, such as the presence of the relatively thick buffer layer 150 of about 5 μm according to an embodiment, prevents formation of the single-heterostructure-like waveguide with the optical confinement between the boundaries 145 and 155, thus preventing generation of a parasitic lasing modes optically gained in the active medium situated within the buffer layer 150. The relatively high barrier layer 140, the strong doping of layers 120, 130, 140, 150, 160, the low pumping efficiency of the active layer 130, and the electric-field-induced gain control in the active layer 130 are used to suppress premature lasing of the semiconductor component 100 in the active layer 130.

The aforementioned reduction in the pumping efficiency due to the placing of the barrier layer 140 and the buffer layer 150 between the p-n junction 155 and the active layer 130 causes a lasing delay of few nanoseconds, thus providing drastically lower requirements for the speed of the current driver. The lasing delay can be controlled by controlling the efficiency of the optical pumping of the active region 130. The last one can be achieved by a proper selection of the band gap values 136 and 156 in the active layer 130 and the buffer layer 130 and/or by a change in the length 612 and the width 610 of the optical resonator. Furthermore, the lasing delay can be additionally controlled by a proper selection of the band gap profile across the active layer 130. At a high pumping current, the carriers form carrier accumulation 133 in the active layer 130 near the junction 125 shown in FIG. 4. An increase in the band gap from junction 135 to junction 125 pursues the aim to increase the local transparency concentration in the active layer 130 in the vicinity of the junction 125. The wider the local value of the band gap, the higher the transparency concentration, and the higher the threshold concentration. This means that the lasing delay is further increased for the same current amplitude, and more significant carrier accumulation can be achieved if a wider band gap is realized in the active layer 130 near the junction 125. In an embodiment, the premature lasing in the active layer 130 can be suppressed by means of increasing the band gap 136 of the active layer 130 in the proximity of the junction 125 shown in FIG. 7A. As a result, more carriers can be accumulated in the active layer 130 without lasing, which further increments the optical pulse power. The preferred length of the adjusted region 131 is about 2 μm from the junction 125.

The local increase in the carrier density in the active layer 130 near the junction 125 causes growth in the position of the quasi-Fermi level and thus the gain spectrum broadens. In the right-hand part of the active layer 130, the absorption predominates, and the overall net gain remains negative. The carrier density can be for example $10^{17}$–$10^{18}$ cm$^{-3}$.

If the current pulse drops, the carriers are redistributed in both the energy and coordinate space within the active layer 130, thus narrowing the gain spectrum and replacing the absorption in the right-hand part of the active layer 130 by the gain. The resulting increase in the gain amplitude causes generation of a high-power, short-pulsing mode.

In an embodiment, the power of the optical pulse 137 is increased by using a moderate build-in electric field induced by a gradual reduction 139 in the band gap 136 from left to right in the central and the right-hand part of the active region 130 shown in FIG. 7B. The effect of the gradual reduction 139 of the band gap 136 is based on a decrease in the time needed for the carrier redistribution within the active layer 130, and thus carrier losses due to spontaneous recombination are reduced.

In principle, the band gap 136 across the active layer 130 can be constant, but the intensity of the nanosecond optical pulse 137 is expected to be lower in this case, due to the following reasons. First, the threshold concentration before the current pulse drops is not enlarged by an increase in the band gap 136 from the left-hand side of the active layer 130, and thus the maximum achievable carrier density has a lower limit. The carrier redistribution across the active layer 130 after the current pulse 300 drops then occurs by means of the carrier diffusion, which is slower than carrier drift in the built-in electric field. Thus, the recombination will reduces the resulting carrier density more significantly in the case of the zero built-in electric field. An increase in the built-in electric field reduces the drift time, so recombination losses of the carriers are reduced and the intensity of the picosecond pulse grows, but this requires a shorter trailing edge of the current pulse 300 to be used for pumping. An optimal value of the built-in electric field is thus defined by compromising between high optical pulse intensity, on one hand, and restrictions to the speed of the current driver, on the other hand. An optimized band gap 136 of the active layer 130 can be obtained as a combination of the aforementioned adjustment of the band gap 136 shown in FIGS. 7A and 7B. Furthermore, applying a current pulse 300 with negative current oscillation after the trailing edge can provide further acceleration of the process of the carrier redistribution in the active layer 130, since the negative current produces an electric field of the same sign as that of the built-in electric field in FIGS. 7A,B.

In an embodiment, the parasitic lasing modes generated in the barrier layer 140, the buffer layer 150, and the contact layer 160 are suppressed by means of the bandgap profile of the buffer layer 150.

In an embodiment, the band gap 136 of the active layer 130 is arranged to restrict stimulated recombination in the proximity of the junction 125.

In an embodiment, the band gap 156 of the buffer layer 150 is arranged to restrict the stimulated recombination in the proximity of the junction 145 by increasing the band gap 156 in the proximity of the junction 145 shown in FIG. 7C. The region to be adjusted 151 can be for example 2 μm.

With reference to FIG. 8, let us examine embodiments of the method according to the invention. The method starts in 800. In 802, the electric pulse 300 is connected to the first contact layer 120 and the second contact layer 160. In 804, the carriers are injected towards the active layer. In 818, an optical pulse 137 is emitted. In 806, the transfer of carriers to the active layer is restricted 130 by the barrier layer 140 such that during the pulse 300 leading edge, the carrier density in the active 130 is below a threshold level required for generation of an optical pulse 137. In 808, generation of the optical pulse 137 is prevented by means of negative overall net gain 202 during the electric pulse 300 leading edge. In 810, optical radiation 147 is generated in order to optically pump the active layer 130. In 812, the semiconductor component is controlled using a buffer layer 150. In 814, the duration of the carrier redistribution is reduced by a gradually decreased band gap profile 136 across the active layer 130. In 816, the stimulated recombination is restricted by an increased band gap 156 of the buffer layer 150 in the proximity of the junction 145 between the barrier layer 140 and the buffer layer 150. It is known to a person skilled in the art that the method steps 804, 806, 808, 810, 812, 814, 816 may take place simultaneously such that the order of performing the steps 804, 806, 808, 810, 812, 814, 816 can be changed in FIG. 8.

The modifications of the band gap profiles described above can be realized with tools of band gap and doping engineering.

Even though the invention has been described above with reference to an example according to the accompanying drawings, it is clear that the invention is not restricted thereto but it can be modified in several manners within the scope of the inventive idea disclosed in the appended claims.

What is claimed is:

1. An optical radiation source for generating an optical pulse, which source is a semiconductor component comprising several functionally interconnected semiconductor structures that comprise a first contact layer and a second contact layer, to which an electric pulse is connected in order to supply energy to semiconductor layers between the contact layers;

an active layer and a p-n junction, which p-n junction injects carriers towards the active layer as a result of the electric pulse, the carriers pumping energy into the active layer, which active layer is arranged to emit an optical pulse as a result of the electric pulse connected to the contact layers, wherein the semiconductor component comprises a barrier layer, which is located between the active layer and the p-n junction;

wherein the active layer is located between the first contact layer and the barrier layer, the layers forming potential barriers on both sides of the active layer;

wherein the barrier layer is arranged to restrict the transfer of minority carriers to the active layer such that during the pulse leading edge, the carrier density in the active layer is below a threshold level required for generating an optical pulse;

wherein the overall net gain in the active layer is arranged to be negative during the electric pulse leading edge to prevent generation of an optical pulse; and wherein during the pulse trailing edge, the overall net gain in the active layer is arranged to become positive and cause a stimulated emission, and the active layer is arranged to emit an optical pulse.

2. An optical radiation source according to claim 1, wherein the semiconductor component comprises a buffer layer, which is located between the active layer and the second contact layer; and wherein the buffer layer is arranged to constitute a p-n junction with the second contact layer.

3. An optical radiation source according to claim 1, wherein the electric pulse connected to the contact layers has a bell-like shape and the duration of the pulse is in the nanosecond range.

4. An optical radiation source according to claim 1, wherein the first contact layer, the active layer and the barrier layer are heavily doped p-type layers, and the second contact layer is an n-type layer.

5. An optical radiation source according to claim 1, wherein the contact layer is arranged to generate optical radiation for optical pumping of the active layer.

6. An optical radiation source according to claim 1, wherein the refractive index of the optically active layer is greater than the refractive indices of the surrounding layers, the active layer thus forming an optical guide.

7. An optical radiation source according to claim 1, wherein the optically active layer is arranged to operate as an optical resonator.

8. An optical radiation source according to claim 1, wherein the band gap of the optically active layer is arranged to emit an optical pulse at a desired wavelength.

9. An optical radiation source according to claim 1, wherein the band gap of the active layer is arranged to restrict stimulated recombination in the proximity of a junction between the active layer and the first contact layer.

10. An optical radiation source according to claim 1, wherein the band gap profile across the active layer is arranged to reduce the duration of carrier redistribution after the electric pulse.

11. An optical radiation source according to claim 2, wherein the buffer layer is doped similarly to the active layer.

12. An optical radiation source according to claim 2, wherein the transfer of carriers in the buffer layer depends on the strength of the electric pulse connected to the contact layers.

13. An optical radiation source according to claim 2, wherein the buffer layer is arranged to generate optical radiation for optical pumping of the active layer, and that the barrier layer is arranged to be permeable to the optical radiation generated by the buffer layer.

14. An optical radiation source according to claim 2, wherein the band gap of the optically active layer and the band gap of the buffer layer are at least approximately equal in order to enable the buffer layer to perform the optical pumping of the optically active layer.

15. An optical radiation source according to claim 2, wherein the band gap of the buffer layer is arranged to restrict stimulated recombination in the proximity of a junction between the barrier layer and the buffer layer.

16. A method of generating optical radiation in a semiconductor component comprising several functionally interconnected semiconductor structures, the method comprising steps of connecting an electric pulse to a first contact layer and a second contact layer in order to supply energy to semiconductor layers between the contact layers;

injecting carriers by means of the electric pulse from a p-n junction towards the active layer, the charge carriers pumping energy into the active layer;

emitting an optical pulse from the active layer by means of the pumped energy, wherein the semiconductor component also comprises a barrier layer, which is located between the active layer and the p-n junction;

wherein the active layer is located between the first contact layer and the barrier layer, which layers form potential barriers on both sides of the active layer; the method further comprising restricting the transfer of carriers to the active layer by the barrier layer such that during the pulse leading edge, the carrier density in the active layer is below a threshold level required for generation of an optical pulse;

preventing generation of an optical pulse by means of negative overall net gain during the electric pulse leading edge; and emitting an optical pulse in the active layer as a result of positive overall net gain in the active layer during the electric pulse trailing edge.

17. A method according to claim 16 further comprising controlling the semiconductor component using a buffer layer, which is located between the active layer and the contact layer, the buffer layer constituting a p-n junction with the contact layer.

18. A method according to claim 16 further comprising controlling the semiconductor component by controlling the transfer of carriers in a buffer layer by means of the electric pulse connected to the contact layers.

19. A method according to claim 16 further comprising connecting the electric pulse, which has a bell-like shape and duration in the nanosecond range.

20. A method according to claim 16, wherein the first contact layer, the active layer and the barrier layer are heavily doped p-type layers, and the second contact layer is an n-type layer.

21. A method according to claim 10 further comprising generating optical radiation by a buffer layer in order to optically pump the active layer.

22. A method according to claim 16 further comprising generating optical radiation by the contact layer in order to optically pump the active layer.

23. A method according to claim 16, wherein the refractive index of the optically active layer is greater than the refractive indices of the surrounding layers, the active layer thus forming an optical guide.

24. A method according to claim 16, wherein the optically active layer is an optical resonator.

25. A method according to claim 16 further comprising emitting an optical pulse from the optical layer at a desired wavelength.

26. A method according to claim 16 further comprising restricting stimulated recombination by an increased band gap of the active layer in the proximity of a junction between the active layer and the first contact layer.

27. A method according to claim 16, further comprising restricting stimulated recombination by an increased band gap of the buffer layer in the proximity of a junction between the barrier layer and the buffer layer.

28. A method according to claim 16 further comprising reducing the duration of the carrier redistribution after the electric pulse by a gradually decreased band gap profile across the active layer in the proximity of a junction between the active layer and the barrier layer.

* * * * *